(12) United States Patent
Hsu

(10) Patent No.: US 6,709,913 B2
(45) Date of Patent: Mar. 23, 2004

(54) METHOD FOR ADJUSTING ULTRA-THIN SOI MOS TRANSISTOR THRESHOLD VOLTAGES

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/945,972

(22) Filed: Sep. 4, 2001

(65) Prior Publication Data

US 2003/0092223 A1 May 15, 2003

(51) Int. Cl.[7] ............... H01L 21/00; H01L 21/8238; H01L 21/331; H01L 21/425; H01L 21/30
(52) U.S. Cl. ............... 438/217; 438/151; 438/162; 438/311; 438/370; 438/526; 438/459; 438/977
(58) Field of Search ............... 438/151, 162, 438/217, 311, 370, 526, 459, 977

(56) References Cited

U.S. PATENT DOCUMENTS

| | | | |
|---|---|---|---|
| 5,116,771 A | * | 5/1992 | Karulkar |
| 5,773,152 A | * | 6/1998 | Okonogi |
| 6,043,536 A | * | 3/2000 | Numata et al. |
| 6,051,452 A | * | 4/2000 | Shigyo et al. |
| 6,350,703 B1 | * | 2/2002 | Sakaguchi et al. |
| 6,403,433 B1 | * | 6/2002 | Yu et al. |
| 6,413,802 B1 | * | 7/2002 | Hu et al. |
| 6,420,218 B1 | * | 7/2002 | Yu |
| 6,420,767 B1 | * | 7/2002 | Krishnan et al. |
| 6,448,161 B1 | * | 9/2002 | Krivokapic |
| 2002/0022348 A1 | * | 2/2002 | Sakaguchi et al. |
| 2002/0168802 A1 | * | 11/2002 | Hsu et al. |

* cited by examiner

Primary Examiner—John F. Niebling
Assistant Examiner—Stanetta Isaac
(74) Attorney, Agent, or Firm—David C. Ripma; Matthew K. Rabdau; Scott C. Krieger

(57) ABSTRACT

A method of adjusting the threshold voltage in an ultra-thin SOI MOS transistor includes preparing a SOI substrate; thinning the SOI top silicon film to a thickness of between about 10 nm and 50 nm; forming an absorption layer on the top silicon film; and implanting ions into the top silicon film through the absorption layer.

20 Claims, 1 Drawing Sheet

METHOD FOR ADJUSTING ULTRA-THIN SOI MOS TRANSISTOR THRESHOLD VOLTAGES

FIELD OF THE INVENTION

This invention relates to the adjustment of voltage threshold in an integrated circuit, and specifically to the adjustment of a voltage for a CMOS formed on a SOI substrate.

BACKGROUND OF THE INVENTION

The uniformity of the top silicon film in a silicon-on-insulator (SOI) device may vary by as much as ±5 nm. While this variation is relatively small for a top silicon film having a thickness greater than 100 nm, the variation for a top silicon film when the film is less than 20 nm thick is on the order of 25%. When the top silicon film is thinned, as by a thermal oxidation process, the film thickness may vary from 15 nm to 25 nm. A 25% variation in the uniformity of the thickness of the top silicon film renders threshold adjustment difficult in such cases.

State-of-the-art fully-depleted SOI threshold voltage adjustment techniques require either uniform doping of the SOI film, providing a uniformly distributed doping density, which causes the threshold voltage to increase linearly with the thickness of the top silicon film; or implantation of specific ions into the SOI to provide a constant total dopant in the top silicon film, however, as the top silicon film becomes very thin, it becomes more difficult to control the total doping density over a top silicon film of varying thickness. Neither technique provides threshold voltage adjustments uniformly within the SOI film. The ultra thin SOI film is obtained by thinning normal SOI film with a thermal oxidation process. The amount of silicon removed by thermal oxidation is very uniform across a SOI wafer. As a result, any non-uniformity in the original SOI film is transferred to the ultra thin SOI film. If the original SOI film is 100 nm±10 nm, thinning the film to 20 nm produces a SOI film thickness across the wafer of 20 nm±10 nm. This results in a film thickness variation increase from 10% to 50%, which severely affects the threshold voltage of a resultant MOS transistor.

SUMMARY OF THE INVENTION

A method of adjusting the threshold voltage in an ultra-thin SOI MOS transistor includes preparing a SOI substrate; thinning the SOI top silicon film to a thickness of between about 10 nm and 50 nm; forming an absorption layer on the top silicon film; and implanting ions into the top silicon film through the absorption layer.

It is an object of the invention to provide a method to minimize or eliminate the thickness dependence of ultra-thin SOI MOS transistor threshold voltage.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The threshold voltage, $V_{TH}$, of silicon-on-insulator (SOI) transistor may be expressed as follows:

$$V_{TH} = V_{FB} + 2\phi_F + (Q_{SUB} + Q_{SI})\frac{1}{C_{OX}} = \quad \text{(Eq. 1)}$$

$$V_{FB} + 2\phi_F \left[1 + \frac{1}{C_{OX}\left(\frac{1}{2C_{SUB}} + \frac{1}{C_{BOX}} + \frac{1}{C_{SI}}\right)}\right] +$$

$$\frac{Q_{SI}}{C_{OX}}\left[1 - \frac{1}{2C_{SI}\left(\frac{1}{2C_{SUB}} + \frac{1}{C_{BOX}} + \frac{1}{C_{SI}}\right)}\right]$$

Where $V_{FB}$ is the flatband voltage, $Q_{SUB}$ is the charge at the back interface of the buried oxide of the SOI wafer; $Q_{SI}$ is the total charge in the top silicon film of the SOI wafer, $C_{BOX}$ is the buried oxide capacitance, $C_{OX}$ is the gate oxide capacitance. The surface potential at the threshold of the surface channel formation, $2\phi_F$, is given by:

$$2\phi_F = Q_{SUB}\left(\frac{1}{2C_{SUB}} + \frac{1}{C_{BOX}} + \frac{1}{C_{SI}}\right) + Q_{SI}\left(\frac{1}{2C_{SI}}\right) \approx \quad \text{(Eq. 2)}$$

$$Q_{SUB}\left(\frac{1}{C_{BOX}}\right) + Q_{SI}\left(\frac{1}{2C_{SI}}\right)$$

Because the buried oxide is in the order of a 100 nm, $C_{BOX}$ is much smaller than $C_{SI}$, and is also much smaller than $C_{SUB}$ and $C_{OX}$. Therefore the threshold voltage is approximately given by:

$$V_{TH} \approx V_{FB} + 2\phi_F\left(1 + \frac{C_{BOX}}{C_{OX}}\right) + \frac{Q_{SI}}{C_{OX}}\left(1 - \frac{C_{BOX}}{2C_{SI}}\right) \quad \text{(Eq. 3)}$$

Because $C_{SI} \gg C_{BOX}$, the threshold voltage is approximately given as:

$$V_{TH} \approx V_{FB} + 2\phi_F\left(1 + \frac{C_{BOX}}{C_{OX}}\right) + \frac{Q_{SI}}{C_{OX}}. \quad \text{(Eq. 4)}$$

The Fermi potential, $\phi_F$, increases logarithmically with doping density. Therefore $\phi_F$ may be treated as independent of the doping density variation in the SOI wafer, and the variation of the threshold voltage is directly proportional to the total charge in the SOI film.

$$\Delta V_{TH} \approx \frac{\Delta Q_{SI}}{C_{XO}} \quad \text{(Eq. 5)}$$

As shown in the above equations, the Fermi potential and the total charge in the top silicon film control the threshold voltage of the transistor. If the doping density at the top silicon film is held constant, the threshold voltage increases with $Q_{SI}$, which increases linearly with the top silicon film thickness. If the total charge in the top silicon film is held constant, the doping density of the top silicon film increases with decreasing film thickness. As a result, the Fermi potential increases with decreasing top silicon film thickness. Therefore, the threshold voltage of the transistor increases as the top silicon film thickness is reduced.

In the case of ultra thin silicon film, on the order of less than 50 nm, it is not possible to keep the total charge in the top silicon film constant. An alternative method is required for adequate threshold voltage control, as described herein.

Figure 1:
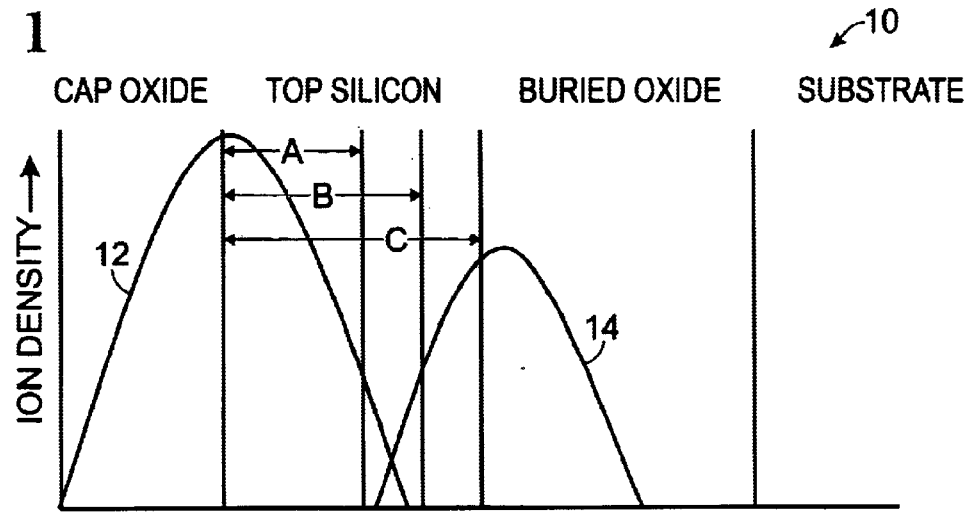
FIG. 1 depicts a graph of ion density v, depth in an SOI device.

The method of the invention includes ion implantation of doping impurities into the top silicon film by implanting through an oxide or nitride film, referred to herein as an absorption layer, which is formed on the SOI top silicon film by CVD. Because the top silicon film is very thin, a number of the implanted ions will penetrate the top silicon film and lodge in the buried oxide. The result is that the total number of ions implanted in the top silicon portion, which is very thin, will be fewer than the number of ions implanted in the thicker portion of the top silicon layer of the wafer. $Q_{SI}$ is larger in the thicker portion of the top silicon film, while the doping density of the thinner portion of the top silicon film is larger than that of the thicker top silicon film. The Fermi potential of the thinner portion of the top silicon film is also larger than that of the thicker portion of the top silicon film. Therefore, the threshold voltage of the transistor will be less dependent on the top silicon film thickness. This is illustrated in FIG. 1, generally at 10, where A, B, and C are the thicknesses of the thinnest, the average, and the thickest portions, respectively, of the top silicon film on the SOI substrate. After the first ion implantation step, represented by curve 12, the threshold voltage of the thickest portion of the top silicon film may be too low. Additional ions may be implanted to provided the proper threshold voltage. The projected range of the second ion implantation step, represented by curve 14, is at least equal to the thickness of the thickest portion of the top silicon film, as shown at 12. The second ion implantation step lodges most of the implanted ions in the thick portion of the top silicon film, while placing a negligible number of ions into the thinner portion of the top silicon film.

The first implantation step may include implantation of phosphorus ions, at a dose of about $1 \cdot 10^{11}$ cm$^{-2}$ to $1 \cdot 10^{13}$ cm$^{-2}$, and at an energy level of 30 keV to 60 keV, resulting in an ion density of between about $5 \cdot 10^{10}$ ions/cm$^2$ to $5 \cdot 10^{13}$ ions/cm$^2$ in the top silicon film. An alternate first implantation step may include implantation of boron ions, at a dose of about $1 \cdot 10^{11}$ cm$^{-2}$ to $1 \cdot 10^{13}$ cm$^{-2}$, and at an energy level of 3 keV to 10 keV, resulting in an ion density of between about $1 \cdot 10^{17}$ ions/cm$^3$ to $5 \cdot 10^{18}$ ions/cm$^3$ in the top silicon film.

The second implantation step may include implantation of arsenic ions, at a dose of about $5 \cdot 10^9$ cm$^{-2}$ to $1 \cdot 10^{12}$ cm$^{-2}$, and at an energy level of 30 keV to 70 keV, resulting in an ion density of between about 0 ions/cm$^2$ to $5 \cdot 10^{11}$ ions/cm$^2$ in the top silicon film. An alternate second implantation step may include implantation of boron ions, at a dose of about $5 \cdot 10^9$ cm$^{-2}$ to $1 \cdot 10^{12}$ cm$^{-2}$, and at an energy level of 5 keV to 15 keV, resulting in an ion density of between about $1 \cdot 10^9$ ions/cm$^2$ to $2 \cdot 10^{10}$ ions/cm$^2$ in the top silicon film.

For example, given a top silicon film layer which varies from 15 nm to 25 nm in thickness, and an absorption layer of oxide having a thickness of 20 nm, the first implantation step may use boron ions, at a dose of about $6 \cdot 10^{12}$ cm$^{-2}$, at an energy level of about 6 keV, resulting in an ion density of about $5.6 \cdot 10^{12}$ ions/cm$^2$ in the thin portions of the top silicon film; $6 \cdot 10^{12}$ ions/cm$^2$ in the average thickness portion, and $6.2 \cdot 10^{12}$ ions/cm$^2$ in the thicker portions of the top silicon film. The second implantation step may use boron ions, at a dose of about $3 \cdot 10^{10}$ cm$^{-2}$, at an energy level of about 14 keV, resulting in a ion an ion density of less than $1.0 \cdot 10^9$ ions/cm$^2$ in the thin portions of the top silicon film; about $7 \cdot 10^9$ ions/cm$^2$ in the average thickness portion, and $2 \cdot 10^{10}$ ions/cm$^2$ in the thicker portions of the top silicon film.

Figure 2:
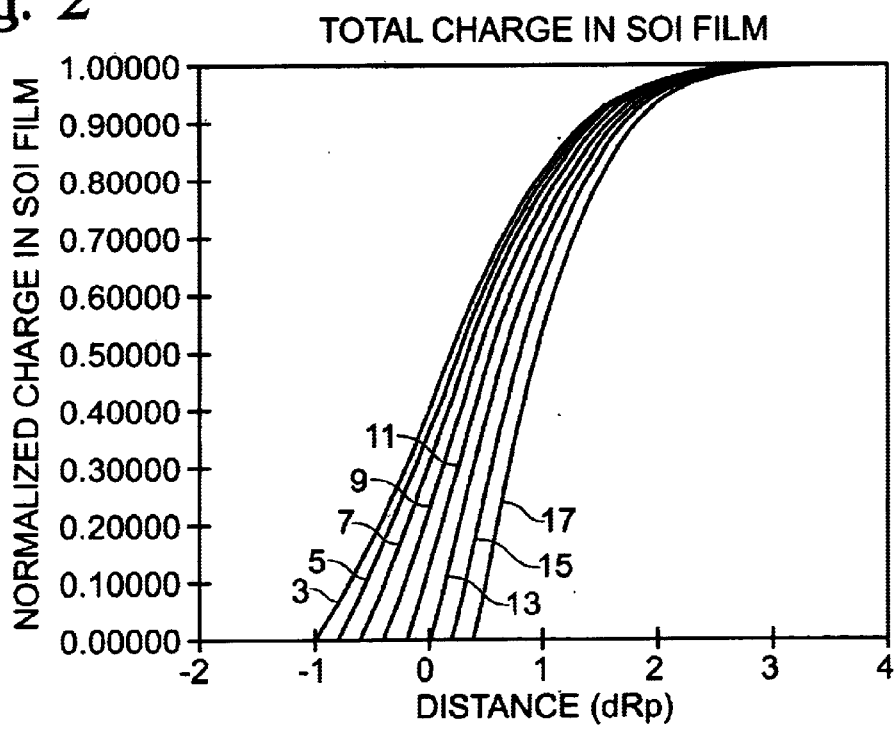
FIG. 2 depicts a graph of the total charge in the top silicon film v, film thickness.

FIG. 2 depicts the normalized charge v. distance. FIG. 2 depicts the total charge in the top silicon film due to the first ion implantation step as a function of film thickness. The vertical axis is the normalized total ion density and the horizontal axis is the distance from the surface, in units of projected standard deviation, ($dR_p$ or $\Delta R_p$ (nm)), of the ion implantation. The intersection of the curves with the horizontal axis is the location of the projected range. Where the projected range is deeper than the oxide or nitride masking layer, the curve intersects the horizontal axis at a positive value, as is shown by series 15 and 17. Where the projected range is shallower than the masking layer, the curve intersects the horizontal axis at a negative value, as shown by series 3 through 11. Where the projected range is equal to the thickness of the masking layer, the curve intersects the horizontal axis at 0, as shown by series 13. The upper surface of the SOI top silicon film is at the 0 charge (the X-axis) in SOI. For example, Series 3 intersects the X-axis at dRp=−1. Series 13 intersects the X-axis at dRp=0. The Y-axis is the total charge in the top silicon film thickness in terms of dRp, measured from the intersection a the X-axis.

Table 1 lists the normalized charge in the top silicon film, with the projected range and the projected standard deviation. It is assumed that the thickness of the thinnest and the thickest top silicon film are, respectively, 15 nm and 25 nm. The thickness of the gate oxide is assumed to be 2 nm. The buried oxide is assumed to be 200 nm thick. The average thickness of the top silicon film is 20 nm. The total charge and the average charge density in the top silicon film are shown in Table 2. The threshold voltage of the MOS transistor is also calculated and shown in Table 3. The first row depicts values for a constant doping density, N, throughout the top silicon film. The second row depicts values where the total charge, Q, in the top silicon film is independent of the film thickness. The threshold voltage variation of the constant charge at the top silicon film is much less dependent on the thickness of the top silicon film. The threshold voltage of the 20 nm top silicon transistor, having a doping density of $2 \cdot 10^{18}$ cm$^{-3}$ is 0.2566 V, while that of the thickest and thinnest top silicon film portions of the wafer are 0.3491 V and 0.1641 V, respectively. The variation of the threshold voltage is ±92.5 mV. In the case of constant charge, the threshold voltage of the thickest film and that of the thinnest film is −5.9 mV and −7.6 mV, respectively, from the threshold voltage of the normal thickness transistor. It is thus desirable to have a constant charge in the top silicon film, however, when the top silicon film is very thin, a constant charge can only be achieved with ultra-low energy ion implantation, i.e., using the 20 nm top silicon film example, for boron ions, an energy lower than 500 eV is required, and for phosphorus ions, an energy less than 1 KeV is required. Where the top silicon film is less than 20 nm thick, an even lower implantation energy is required.

TABLE 1

| Series # | $\Delta R_p$ (nm) | 25 nm | 20 nm | 15 nm |
|---|---|---|---|---|
| Series #3 | 10 | 0.93 | 0.81 | 0.62 |
|  | 8 | 0.97 | 0.92 | 0.80 |
|  | 6 | 1.00 | 0.98 | 0.88 |
|  | 4 | 1.00 | 1.00 | 1.00 |
| Series #13 | 10 | 0.99 | 0.97 | 0.90 |
|  | 9 | 0.99 | 0.97 | 0.91 |
|  | 8 | 1.00 | 0.99 | 0.97 |
|  | 6 | 1.00 | 1.00 | 0.99 |
|  | 4 | 1.00 | 1.00 | 1.00 |
| Series #9 | 10 | 0.97 | 0.92 | 0.80 |
|  | 9 | 0.98 | 0.95 | 0.84 |
|  | 8 | 1.00 | 0.97 | 0.91 |
|  | 7 | 1.00 | 0.99 | 0.93 |
|  | 6 | 1.00 | 1.00 | 0.98 |

TABLE 2

| Series # | $\Delta R_p$ (NM) | Q 25 (nm) ($\times 10^{-7}$ C) | Q 20 (nm) ($\times 10^{-7}$ C) | Q 15 (nm) ($\times 10^{-7}$ C) | N 25 (nm) ($\times 10^{18}$ C) | N 20 (nm) ($\times 10^{18}$ C) | N 15 (nm) ($\times 10^{18}$ C) |
|---|---|---|---|---|---|---|---|
| Constant N | | 8.0000 | 6.4000 | 4.8000 | 2.000 | 2.000 | 2.000 |
| Constant Q | | 6.4000 | 6.4000 | 6.4000 | 1.600 | 2.000 | 2.667 |
| 3 | 10 | 7.3481 | 6.4000 | 4.8988 | 1.837 | 2.000 | 2.041 |
| 3 | 8 | 6.7478 | 6.4000 | 5.5652 | 1.687 | 2.000 | 2.319 |
| 3 | 6 | 6.5306 | 6.4000 | 5.7469 | 1.633 | 2.000 | 2.395 |
| 3 | 4 | 6.4000 | 6.4000 | 6.4000 | 1.600 | 2.000 | 2.667 |
| 13 | 10 | 6.5320 | 6.4000 | 5.9381 | 1.633 | 2.000 | 2.474 |
| 13 | 9 | 6.5320 | 6.4000 | 6.0041 | 1.633 | 2.000 | 2.502 |
| 13 | 8 | 6.4646 | 6.4000 | 6.2707 | 1.616 | 2.000 | 2.613 |
| 13 | 6 | 6.4000 | 6.4000 | 6.3360 | 1.600 | 2.000 | 2.640 |
| 13 | 4 | 6.4000 | 6.4000 | 6.4000 | 1.600 | 2.000 | 2.667 |
| 9 | 10 | 6.7478 | 6.4000 | 5.5652 | 1.687 | 2.000 | 2.319 |
| 9 | 9 | 6.6021 | 6.4000 | 5.6589 | 1.651 | 2.000 | 2.358 |
| 9 | 8 | 6.5649 | 6.4000 | 6.0041 | 1.641 | 2.000 | 2.502 |
| 9 | 7 | 6.4646 | 6.4000 | 6.0121 | 1.616 | 2.000 | 2.505 |
| 9 | 6 | 6.400 | 6.4000 | 6.2720 | 1.600 | 2.000 | 2.613 |
| 2II | | 6.9646 | 6.5810 | 6.3077 | 1.7410 | 2.0566 | 2.6284 |

TABLE 3

| Series # | $\Delta R_p$ (nm) | $V_T$ 25 (nm) | $V_T$ 20 (nm) | $V_T$ 15 (nm) | $\Delta V_T$ 25-20 (nm) | $\Delta V_T$ 20-15 (nm) |
|---|---|---|---|---|---|---|
| Constant N | | 0.3491 | 0.2566 | 0.1641 | 0.0925 | 0.0925 |
| Constant Q | | 0.3119 | 0.3178 | 0.3255 | -0.0059 | -0.0076 |
| 3 | 10 | 0.3704 | 0.3178 | 0.2315 | 0.0526 | 0.0863 |
| 3 | 8 | 0.3334 | 0.3178 | 0.2735 | 0.0156 | 0.0443 |
| 3 | 6 | 0.3200 | 0.3178 | 0.2848 | 0.0022 | 0.0330 |
| 3 | 4 | 0.3119 | 0.3178 | 0.3255 | -0.0059 | -0.0076 |
| 13 | 10 | 0.3201 | 0.3178 | 0.2968 | 0.0022 | 0.0211 |
| 13 | 9 | 0.3201 | 0.3178 | 0.3009 | 0.0022 | 0.0169 |
| 13 | 8 | 0.3159 | 0.3178 | 0.3174 | -0.0019 | 0.0004 |
| 13 | 6 | 0.3119 | 0.3178 | 0.3215 | -0.0059 | -0.0037 |
| 13 | 4 | 0.3119 | 0.3178 | 0.3255 | -0.0059 | -0.0076 |
| 9 | 10 | 0.3334 | 0.3178 | 0.2735 | 0.0156 | 0.0443 |
| 9 | 9 | 0.3244 | 0.3178 | 0.2793 | 0.0066 | 0.0385 |
| 9 | 8 | 0.3221 | 0.3178 | 0.3009 | 0.0043 | 0.0169 |
| 9 | 7 | 0.3159 | 0.3178 | 0.3014 | -0.0019 | 0.0164 |
| 9 | 6 | 0.3119 | 0.3178 | 0.3175 | -0.0059 | 0.0003 |
| 2II | | 0.3190 | 0.3190 | 0.3177 | 0.0000 | 0.0013 |

Using the method of the invention, the best results are shown in connection with series 13 ion implantation, having a standard deviation of 8 nm. This was achieved by implanting boron ions at an energy level of 6 keV or phosphorus ions at an energy level of 20 keV for the first ion implantation step. For transistors having top silicon film thicknesses of 25 nm, 20 nm and 15 nm, the calculated threshold voltages are 0.3159 V, 0.3178 V and 3174 V, respectively. The threshold voltage of the thickest film and that of the thinnest film are 1.9 mV and 0.4 mV, respectively, from that of a nominal transistor, and is indicated in the bold area of Table 3.

The threshold voltage uniformity may be further improved with an additional deep ion implantation, as shown in FIG. 1, at 14. The SOI wafer is subjected to a second ion implantation of 40 KeV arsenic at a does of $2.7 \cdot 10^{10}$ cm$^{-2}$. The results are shown in row 2II of Tables 2 and 3. The threshold voltage of a MOS transistor having 25 nm, 20 nm and 15 nm top silicon film are 0.3190 V, 0.3190 V and 0.3177 V, respectively. The second ion implantation step is operable to increase the threshold voltage of the thicker portions of the top silicon film transistor. The threshold voltage variation for a SOI wafer having a thickness variation of 15 nm to 25 nm is 1.3 mV. The advantage of the this variation of the method of the invention is that threshold voltage adjustment increases with decreasing top silicon film thickness.

Thus, a method for adjusting ultra-thin SOI MOS transistor threshold voltages has been disclosed. It will be appreciated that further variations and modifications thereof may be made within the scope of the invention as defined in the appended claims.

I claim:

1. A method of adjusting the threshold voltage in an ultra-thin SOI MOS transistor, comprising:
   preparing a SOI substrate, including forming a buried oxide layer and a SOI top silicon layer;
   thinning the SOI top silicon film to a thickness of between about 10 nm and 50 nm;
   forming an absorption layer on the top silicon film; and
   implanting ions into the top silicon film through the absorption layer to provide and maintain a constant total charge per unit area of the top silicon film of the MOS transistor.

2. The method of claim 1 wherein said thinning includes thinning by thermal oxidation.

3. The method of claim 1 wherein said forming an absorption layer includes forming a layer of material taken from the group of materials consisting of silicon oxide and silicon nitride.

4. The method of claim 1 wherein said implanting includes a first implantation step of phosphorus ions, at a dose of about $1 \cdot 10^{11}$ cm$^{-2}$ to $1 \cdot 10^{13}$ cm$^{-2}$, and at an energy level of 30 keV to 64 keV.

5. The method of claim 4 wherein said first implantation step includes providing an ion density of between about $5 \cdot 10^{10}$ ions/cm$^2$ to $5 \cdot 10^{13}$ ions/cm$^2$ in the top silicon film.

6. The method of claim 4 wherein said implanting includes a second implantation step of arsenic ions, at a dose of about $5 \cdot 10^9$ cm$^9$ cm$^9$ to $1 \cdot 10^{12}$ cm$^{-2}$, and at an energy level of 30 keV to 70 keV.

7. The method of claim 6 wherein said second implantation step includes providing an ion density of between about 0 ions/cm$^2$ to $5 \cdot 10^{11}$ ions/cm$^2$ in the top silicon film.

8. The method of claim 1 wherein said implanting includes a first implantation step of boron ions, at a dose of about $1 \cdot 10^{11}$ cm$^{-2}$ to $1 \cdot 10^{13}$ cm$^{-2}$, and at an energy level of 3 keV to 10 keV.

9. The method of claim 8 wherein said first implantation step includes providing an ion density of between about $1 \cdot 10^{17}$ ions/cm$^3$ to $5 \cdot 10^{18}$ ions/cm$^3$ in the top silicon film.

10. The method of claim 8 wherein said implanting includes a second implantation step of boron ions, at a dose of about $5 \cdot 10^9$ cm$^{-2}$ to $1 \cdot 10^{12}$ cm$^{-2}$, and at an energy level of 5 keV to 15 keV.

11. The method of claim 10 wherein said second implantation step includes providing an ion density of between about $1\cdot10^9$ ions/cm$^2$ to $2\cdot10^{10}$ ions/cm$^2$ in the top silicon film.

12. A method of adjusting the threshold voltage in an ultra-thin SOI MOS transistor, comprising:
preparing a SOI substrate;
thinning the SOI top silicon film to a thickness of between about 10 nm and 50 nm;
forming an absorption layer on the top silicon film, including forming a layer of material taken from the group of materials consisting of silicon oxide and silicon nitride; and
implanting ions into the top silicon film through the absorption layer, including a first implantation step and a subsequent second implantation step, to provide and maintain a constant total charge per unit area of the top silicon film of the SOI MOS transistor.

13. The method of claim 12 wherein said thinning includes thinning by thermal oxidation.

14. The method of claim 12 wherein said first implantation step includes implantation of phosphorus ions, at a dose of about $1\cdot10^{11}$ cm$^{-2}$ to $1\cdot10^{13}$ cm$^{-2}$, and at an energy level of 30 keV to 60 keV, resulting in a phosphorus ion density of between about $5\cdot10^{10}$ ions/cm$^2$ to $5\cdot10^{13}$ ions/cm$^2$ in the top silicon film.

15. The method of claim 12 wherein said second implantation step include implantation of arsenic ions, ax a dose of about $5\cdot10^9$ cm$^{-2}$ to $1\cdot10^{12}$ cm$^{-2}$, and at an energy level of 30 keV to 70 keV, resulting in an arsenic ion density of between about 0 ions/cm$^2$ to $5\cdot10^{11}$ ions/cm$^2$ in the top silicon film.

16. The method of claim 12 wherein said first implantation step includes implantation of boron ions, at a dose of about $1\cdot10^{11}$ cm$^{-2}$ to $1\cdot10^{13}$ cm$^{-2}$, and at an energy level of 3 keV to 10 keV, resulting in a boron ion density of between about $1\cdot10^{17}$ ions/cm$^3$ to $5\cdot10^{18}$ ions/cm$^3$ in the top silicon film.

17. The method of claim 12 wherein said second implantation step includes implantation of boron ions, at a dose of about $5\cdot10^9$ cm$^{-2}$ to $1\cdot10^9$ cm$^{-2}$, and at an energy level of 5 keV to 15 keV, resulting in a boron ion density of between about $1\cdot10^9$ ions/cm$^2$ to $2\cdot10^{10}$ ions/cm$^2$ in the top silicon film.

18. A method of adjusting the threshold voltage in an ultra-thin SOI MOS transistor, comprising:
preparing a SOI substrate, including forming a buried oxide layer and a SOI top Silicon layer;
thinning the SOI top silicon film to a thickness of between about 10 nm and 50 nm;
forming an absorption layer on the top silicon film; and
implanting ions into the top silicon film through the absorption layer, including a first implantation step and a subsequent second implantation stop, wherein said first implantation stop includes implanting ions taken from the group of implanted ions consisting of phosphorus ions, at a dose of about $1\cdot10^{11}$ cm$^{-2}$ to $1\cdot10^{13}$ cm$^{-2}$, and at an energy level of 30 keV to 60 keV, resulting in a phosphorus ion density of between about $5\cdot10^{10}$ ions/ant to $5\cdot10$ ions/cm$^2$ in the top silicon film and boron ions, at a dose of about $1\cdot10^{11}$ cm$^{-2}$ to $1\cdot10^{13}$ cm$^{-2}$, and at an energy level of 3 keV to 10 keV, resulting in a boron ion density of between about $1\cdot10^{17}$ ions/cm$^3$ to $5\cdot10^{18}$ ions/cm$^3$ in the top silicon film; and wherein said second implantation step includes implanting ions taken from the group of implanted ions consisting of arsenic ions, at a dose of about $5\cdot10^9$ cm$^{-2}$ to $1\cdot10^{12}$ cm$^{-2}$, and at an energy level of 30 key to 70 keV, resulting in an arsenic ion density of between about 0 ions/cm$^2$ to $5\cdot10^{11}$ ions/cm$^2$ in the top silicon film and boron ions, at a dose of about $5\cdot10^{-2}$ to $1\cdot10^{12}$ cm$^{-2}$, and at an energy level of 5 keV to 15 keV, resulting in a boron ion density of between about $1\cdot10^9$ ions/cm$^2$ to $2\cdot10^{10}$ ions/cm$^2$ in the top silicon film, to provide and maintain a constant total charge net unit of the too silicon film of the SOI MOS transistor.

19. The method of claim 18 wherein said forming an absorption layer includes forming a layer of material taken from the group of materials consisting of silicon oxide and silicon nitride.

20. The method of claim 18 wherein said thinning includes thinning by thermal oxidation.

* * * * *